(12) United States Patent
Zank et al.

(10) Patent No.: US 6,900,642 B2
(45) Date of Patent: May 31, 2005

(54) AIRCRAFT ELECTROSTATIC DISCHARGE TEST SYSTEM

(75) Inventors: Paul A. Zank, Brookline, NH (US); Eldon M. Sutphin, Merrimack, NH (US); David W. Buchanan, Brookline, NH (US); Thomas G. Cehelnik, Cypress, TX (US)

(73) Assignee: BAE Systems Information and Electronic Systems Integration INC, Nashua, NH (US)

( * ) Notice: Subject to any disclaimer, the term of this patent is extended or adjusted under 35 U.S.C. 154(b) by 174 days.

(21) Appl. No.: 10/256,812

(22) Filed: Sep. 27, 2002

(65) Prior Publication Data

US 2003/0071628 A1 Apr. 17, 2003

Related U.S. Application Data

(60) Provisional application No. 60/340,176, filed on Dec. 10, 2001, and provisional application No. 60/325,878, filed on Sep. 28, 2001.

(51) Int. Cl.$^7$ ............................................. G01R 29/12
(52) U.S. Cl. .................................... 324/457; 324/72
(58) Field of Search ....................... 324/72, 457, 452, 324/109, 458, 365; 244/17.13, 17.15, 17.17, 1 A, 205; 340/657, 933, 854.8, 870.01, 562, 564; 73/861.12

(56) References Cited

U.S. PATENT DOCUMENTS

| | | | |
|---|---|---|---|
| 3,260,893 A | 7/1966 | De La Cierva | 361/218 |
| 3,641,427 A | 2/1972 | Pittman et al. | 324/365 |
| 3,790,884 A | 2/1974 | Kohl | 324/72 |
| 3,839,912 A | 10/1974 | Schmoock et al. | 73/861.12 |
| 3,857,066 A | 12/1974 | Cline et al. | 361/218 |
| 3,874,616 A * | 4/1975 | Buser et al. | 244/17.11 |
| 4,005,357 A | 1/1977 | Parkinson | 324/457 |
| 4,101,825 A * | 7/1978 | Truax | 324/458 |
| 4,529,940 A | 7/1985 | Blitshteyn | 324/458 |
| 4,703,179 A | 10/1987 | Motooka | 250/334 |
| 4,736,906 A | 4/1988 | Taillet | 244/1 A |
| 4,765,244 A | 8/1988 | Spector et al. | 102/213 |
| 4,812,713 A | 3/1989 | Blanchard | 315/370 |
| 4,812,822 A | 3/1989 | Feltz et al. | 340/572.4 |
| 4,818,855 A | 4/1989 | Mongeon et al. | 235/440 |
| 4,823,228 A | 4/1989 | Bittner | 361/218 |
| 4,825,149 A | 4/1989 | Voss et al. | 324/72 |

(Continued)

FOREIGN PATENT DOCUMENTS

DE      32 00 302 A1     12/1983

OTHER PUBLICATIONS

PCT Search Report dated Apr. 7, 2003 of Application No. PCT/US02/31070 filed Sep. 27, 2002.

(Continued)

Primary Examiner—Vincent Q. Nguyen
(74) Attorney, Agent, or Firm—Maine & Asmus

(57) ABSTRACT

A low cost diagnostic system for testing the airborne static discharge systems and the grounding systems for aircraft. The present invention is a passive electrostatic detection scheme which in one embodiment is an array of inexpensive, miniaturized sensors for measuring the detected E-field disturbances from aircraft. The measurements are taken on the runway upon arrival and indicate whether the aircraft had an appreciable accumulated charge indicating a failure of the electrostatic discharge system. The system further verifies that the ground discharge devices are properly working and any charge is dissipated upon landing. In one embodiment the measurement information is transmitted to a central location where the aircraft and the measurement data are matched and maintenance is scheduled for aircraft having high levels of electrostatic charge.

17 Claims, 12 Drawing Sheets

U.S. PATENT DOCUMENTS

| | | | |
|---|---|---|---|
| 4,839,581 A | 6/1989 | Peterson, Jr. ................. | 324/72 |
| 4,931,740 A * | 6/1990 | Hassanzadeh et al. ...... | 324/457 |
| 4,975,686 A | 12/1990 | Delcourt ..................... | 340/659 |
| 4,996,473 A | 2/1991 | Markson et al. .............. | 324/72 |
| 5,164,673 A | 11/1992 | Rosener ...................... | 324/457 |
| 5,241,518 A | 8/1993 | McNelis et al. ............ | 367/127 |
| 5,321,615 A | 6/1994 | Frisbie et al. ................. | 701/24 |
| 5,430,448 A | 7/1995 | Bushman ..................... | 342/52 |
| 5,485,092 A | 1/1996 | Fortin ........................ | 324/457 |
| 5,508,697 A | 4/1996 | Kato et al. ................... | 340/933 |
| 5,544,129 A | 8/1996 | McNelis ..................... | 367/127 |
| 5,771,020 A | 6/1998 | Markson et al. ........... | 342/460 |
| 5,828,334 A | 10/1998 | Deegan ....................... | 342/90 |
| 5,903,225 A | 5/1999 | Schmitt et al. ............ | 340/5.25 |
| 5,959,548 A | 9/1999 | Smith ...................... | 340/854.8 |
| 5,963,146 A | 10/1999 | Johnson et al. ........ | 340/870.01 |
| 5,977,762 A | 11/1999 | Murtha, Jr. et al. ........... | 324/72 |
| 6,014,447 A | 1/2000 | Kohnen et al. .............. | 381/86 |
| 6,084,551 A | 7/2000 | Aslan ........................ | 343/725 |
| 6,088,585 A | 7/2000 | Schmitt et al. ............. | 455/411 |
| 6,178,141 B1 | 1/2001 | Duckworth et al. ........ | 367/127 |
| 6,196,130 B1 | 3/2001 | Crist et al. ................... | 102/221 |
| 6,260,797 B1 * | 7/2001 | Palmer ........................ | 244/49 |
| 6,445,294 B1 | 9/2002 | McDonnell et al. ........ | 340/562 |
| 6,456,198 B1 | 9/2002 | Kato et al. ................... | 340/564 |
| 2002/0082769 A1 | 6/2002 | Church et al. .............. | 701/120 |

OTHER PUBLICATIONS

PCT Search Report dated May 29, 2003 of Application No. PCT/US02/39436 filed Dec. 10, 2002.

Beaty, William J., Ridiculously Sensitive Charge Detector, 1987. http://www.amasci.com/emotor/chargdet.html pp. 1–6, no month available.

Hull, Richard, An Experimenters' Electrometer Sniffing out subtle electrostatic phenomena, http://www.amasci.com/electrom/sas51pl.html#electro, 1 page, visited Jul. 17, 2002.

Amptek, Electrostatic Analyzer Detector, Jul. 11, 2001, http://www.amptek.com/esa.html.

Beaty, William, Inexpensive FET Electrometer, 1994, http://www.amasci.com/electrom/e-field2.txt, no month available.

* cited by examiner

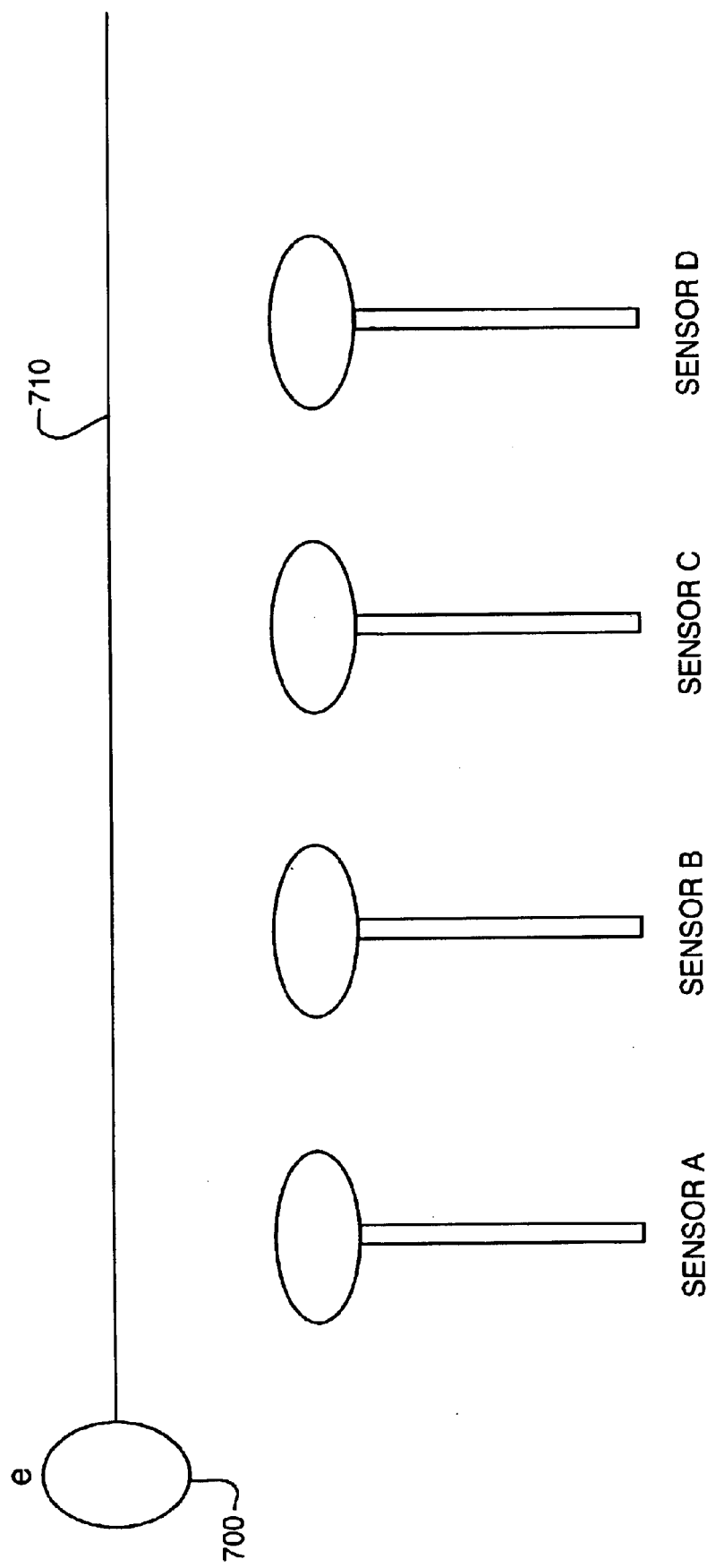

AIRCRAFT ELECTROSTATIC DISCHARGE TEST SYSTEM

CROSS REFERENCE TO RELATED APPLICATIONS

This application claims priority under 35 USC 119(e) to U.S. Provisional Patent Application No. 60/325,878 entitled AIRCRAFT ELECTROSTATIC DISCHARGE TEST SYSTEM, filed on Sep. 28, 2001 and U.S. Provisional Patent Application No. 60/340,176 entitled ELECTRIC FIELD SENSOR filed Dec. 10, 2001.

BACKGROUND OF THE INVENTION

1. Technical Field of the Invention

This invention relates to an apparatus and method for passive testing of the electrostatic discharge systems (ESD) installed on all types of aircraft.

2. Background of the Invention

Air travel and cargo transport has been steadily increasing over the last few decades, resulting in increased number of flights and flight locations. The flights require around the clock transportation of persons and cargo and in all types of weather. With the increasing number of planes in the air at a given time, there is a growing need to keep planes in the air for longer periods and with less maintenance times.

Since deregulation, the commercial air travel industry has experienced dramatic fluctuations in the carriers. Various carriers have come and gone while others have experienced serious economic difficulty. An unfortunate side effect of the economics of air transportation is that routine maintenance schedules and number of experienced maintenance personnel have both been lowered.

An undesirable aspect of aircraft flight is that the aircraft itself often suffers from an accumulation of electrostatic charges through various effects including atmospheric conditions and the motion of the aircraft or parts thereof through the atmosphere. The accumulation of the electrostatic charges tends to build up potentials than can become dangerous and can cause radio frequency interference, electrical shock to persons connected with the aircraft, equipment failures and unwanted ignition of fuel and armament.

For example, there have been some highly publicized plane explosions linked to the build-up of the static charges, particularly in the vicinity of the fuel tanks of the aircraft. There is growing speculation that other plane crashes may be indirectly linked to static electrical problems and failure of aircraft electronics and vital flight systems.

In addition, static charge accumulation also interferes with the radio communication operations or other amplitude modulated equipment that is described in the prior art. Such communication interference creates a particularly hazardous situation during flight operations that include landing of the aircraft since it is necessary that the aircraft be in constant communication with ground control and/or other aircraft during flight operations.

The atmosphere naturally carries a positive charge of approximately 100,000 Volt at a typical flying height of 10,000 meters altitude. The atmospheric charge is associated with the electrical field existing between the Earth and the ionosphere. The low humidity environmental condition at a typical flying altitude is a perfect environment for buildup of large electrostatic charges. It is reasonable to assume that an aircraft can acquire a charge of one million Volts or more, which it shares with the passengers inside the aircraft. The positive charge that is induced by friction from an airplane flying through the atmosphere compounds the positively charged airplane and due to the size of larger planes, an aircraft can acquire a charge of greater than one million Volts.

During landing, especially in dry conditions, sparks can be released to the ground as soon as an aircraft touches down thereby discharging the high potential difference. Larger planes would inevitably have a greater potential, and to facilitate the grounding of the aircraft, metal-rods are fitted to the tips of the aircraft wings in an effort to discharge the aircraft. The static discharge antennas are normally located on wing tips, rudder and elevator.

There is an obvious hazardous condition if the potential is not discharged from the airplane for the personnel that may come into contact or close proximity to the plane. There are detailed guidelines for refueling that require a grounding strap to discharge any accumulated charge promulgated by various federal and state agencies. However, accidents do occur whether by faulty grounding systems or operator error. Thus there is a general desire to ensure that accumulated charges are dissipated.

The static discharge antennas also serve as lightening rods so that when struck by lightening the electricity finds an exit location instead of exiting from other flight control mechanisms.

In addition to the electrostatic discharging rods, most commercial aircraft also use grounding straps to dissipate any charge that did reside. Upon landing, the aircraft employs grounding straps that strike the ground upon landing and discharge accumulated charge from the aircraft skin. While not able to mitigate the static buildup in flight, these straps are supposed to ensure that any charge that did accumulate is properly dissipated to ground.

The grounding straps are subject to maintenance testing both visual and ground based testing. The straps may have broken conductors or connectors that prevent proper electrical connectivity. The testing procedures are costly as the plane is taken out of service and requires skilled maintenance personnel run the testing procedures.

There are some prior art devices for measuring the strength of the electrostatic field between the aircraft and the surrounding environment in order to determine whether or not the electrostatic potential of the aircraft is at a dangerous level. And, there are various electrostatic discharge systems designed to reduce or eliminate charge build up.

Aircraft in flight acquire static electrical charges in several ways. The principal charging is called precipitation charging, and includes charging due to rain, snow, ice crystals and dust. The precipitation charging imparts a net electrical charge on an aircraft and, if allowed to accumulate, can produce corona discharge and severe electrical noise interference in the airborne navigation and communication systems aboard the aircraft. Discharge currents of several milliamperes and airplane voltage of over 200,000 volts have been measured during precipitation charging conditions. A general description of aircraft electrostatic charge is described in the article by the US Army Research Laboratory entitled Electric Field Microsensors: Concept and Model Validation as presented in the Military Magnetic and Electric Field Workshop Oct. 19, 2000.

In U.S. Pat. No. 4,825,149, there is an electric field sensor with a disk electrode coupled to a circuit having a resistor parallel to a capacitor. The output is measured by an oscilloscope, and is described in terms of detecting an electromagnetic pulse accompanying a nuclear detonation.

Published U.S. patent application U.S. 2002/0082769 ('769) discloses an airport auditing and management architecture. This described system encompasses various acoustic sensors and cameras that monitor aircraft activities and coordinate the activities in a central processing location. While not particularly relevant to the sensing device of the present invention, the '769 system illustrates how the sensor data could be implemented into an existing architecture and interact with the various related organizations to monitor electrostatic discharge systems and provide proper maintenance.

There are various electrostatic discharge systems discussed in the prior art, including the helicopter system of U.S. Pat. No. 3,260,893. The operational characteristics describing triboelectric charging is detailed along with the discharging system employed. There are also known devices on airplane wings to discharge static electricity as it is generated, for example, by the friction of water droplets as the plane flies through a cloud. These devices attempt to reduce the charge to levels that might cause radio interference and to prevent explosions such as the Apollo 13 disaster. Faulty electrostatic discharge systems may be responsible for other aircraft crashes whether directly by sparking near a fuel tank or indirectly by damaging vital electronics. And, a faulty discharge system may also lead to more damage from a lightening strike resulting in disaster.

There are various descriptions for detection of weather conditions conducive to lightening, including U.S. Pat. Nos. 5,828,334 and 3,790,884 which generally describe a plurality of antennas that sense changes in the electrostatic field between antennas. A somewhat related invention is described in U.S. Pat. No. 4,975,686 that describes an electrostatic field detection system for persons and furniture in the vicinity of computer electronics.

Electrostatic discharge (ESD) devices are well known, and used with aircraft structures so as to provide for the elimination of static electrical charges accumulated thereon. Such static discharge elements help protect radio systems from precipitation static noise. Prior art ESD designs include trailing discharge elements and tip dischargers that extend beyond the aerodynamic airfoil surfaces in the form of rods. These static discharge elements are constructed of rod-like configurations that extend from a surface portion of an airplane. However, such protrusions increase drag and furthermore are subject to breakage as a result of the additional stress during flight and also by the inadvertent mishandling of the ground personnel during a routine maintenance operation. The rods are also vulnerable to damage from lightning, hail, vibration, bird strikes, and mechanical damage during ground handling. As a consequence, aircraft departure is sometimes delayed if the discharge elements are missing or damaged. The key discharge units are usually the outboard trailing and tip dischargers that are in the highest electrical fields during static charging conditions.

Other static dischargers include using knitted wire mesh material onto a glass fiber composite or electrically nonconductive structural panel, such as a flight control surface of an aircraft, for forming an electrically conductive exterior surface that controls the accumulation of electrostatic charge and protects the underlying panel structure from damage by lightning strikes.

However all the various ESD systems require inspection, maintenance, and repair in order to ensure the safety of the aircraft. The Federal Aviation Agency (FAA) is the US Government agency primarily responsible for managing commercial air travel. They establish the guidelines and requirements and are the responsible for enforcing those requirements. ESD systems are required on all commercial aircraft. These devices are installed and regularly inspected by the skilled ground maintenance personnel and records are supposed to be accurately maintained.

One device for measuring the electrostatic field is called a field mill type. A field mill is a device for measuring electrostatic field strength on the basis of charges induced on a sensor electrode within the field mill that is alternately covered and exposed to the electrostatic field sought to be measured, wherein the alternate covering can be accomplished either electrically or mechanically. The induced charge on the sensor electrode of the field mill is proportional to the external field impinging on the sensor electrode. With appropriate phase convergence, both the strength and polarity of the electrostatic field can be determined.

However, the testing is only done periodically. There is also no current means available for testing the ESD systems in flight. And, there is no way of knowing whether a tested unit will perform adequately until the next scheduled testing/maintenance. The typical maintenance inspection requires experienced field service personnel to use specific instrumentation to check the equipment.

Therefore, it is well known that the buildup of static electricity poses in-flight and ground based hazards. The airborne static discharge system and landing grounding techniques are subject to malfunctions. The routine maintenance schedule is helpful, but may not locate a faulty system until the next scheduled maintenance. What is needed is a system that can passively detect the functionality of aircraft ESD systems and provide low cost diagnostic system for airborne static discharge and grounding systems. Such a system should be inexpensive to install and should be able to monitor aircraft departing or returning in order to schedule ESD maintenance. In order to be easily implemented, such a system should be simple and easy to operate and install. If such a system were available, it would result in cost-savings in relation to maintenance inspections, and, non-implementation could result in liability issues. However the greatest need is for safer air travel as the hazards from the build up of electrostatic charge are extreme.

SUMMARY OF THE INVENTION

The present invention is designed in contemplation of the deficiencies of the prior art. The present invention is a system for the passive testing of the ESD systems of aircraft. A plurality of sensors are installed on or nearby runways, and the electric field sensors are used to passively measure a E-field signature of an aircraft. The sensor data is communicated to a processing unit for signal processing. The E-field signature is compared to a library of signatures to determine if the measurements are within range. Measurements outside a given range indicate that the ESD system of the aircraft is not working properly.

From electromagnetic field theory, it is well known that an infinitely long conductor carrying a current will have an associated magnetic field H in a circular pattern concentric about the conductor, and an electric field E-field directed radially away from the conductor. From this, it is apparent that the means for sensing an electric and a magnetic field would be different, as well as the circuitry for interpreting the sensed electric and magnetic fields.

E-fields are an unintended and unavoidable electrostatic emissions in the spectrum from sub 1 Hz to greater than 1 MHz. E-field distortions are caused by the spatial imbalance of ions, wherein such distortions are caused by the movement of charged bodies disrupting the electric fields. Examples of E-field distortions include high voltage power lines, surface friction on some materials such as plastics, certain aerosols, and even human, animal and object movement. For example, humans afford sufficient conductivity to measurably distort the isopotential lines of the proximate E-field. And, E-fields are also generated by planes and other aircraft as they move through the air and cause E-field disruptions.

As is established in the prior art, aircraft movement of the electrostatic charges (electric monopoles) induces currents that can be picked up by sensors. The induced or sensed current is proportional to the sensor size, the target charge, the velocity, target size, and the range.

The E-field disruptions for particular aircraft tend to have similar characteristics. Based upon empirical data, the E-field data from particular aircraft are very similar. With the ESD units working, the E-field signature of a plane should fall within certain boundaries and measurements outside that range indicate that the ESD system may be malfunctioning.

The present invention detects E-field distortions caused by the spatial imbalance of ions. Such measurements are communicated to a processing unit and finally compared to a library of measurements containing the expected profile for a given airplane.

In addition, the present invention's use of at least two E-field sensors in conjunction with a means of coherent signal processing enables substantial reduction of background noise. This, in turn, permits detection of E-field distortion at greater ranges and facilitates signature correlation of the detected object with characteristic E-field distortions of like and similar sources.

A combination of two or more of the present invention's E-field sensors, or the combination of at least one E-field sensor in conjunction with at least one other sensor can be used in determining the range and approximate location of the source of the E-field distortion.

One embodiment of the present invention is a detection system comprising an array of inexpensive, miniaturized sensors that are easily deployable and are in communication with a means of processing and outputting the detected E-field disturbance indications for interpretive display and analysis. It is anticipated that the relative simplicity of the sensor devices and their low power requirement of 1–2 milliwatts enables persons of ordinary skill in the art to augment or supplant battery power sources with, for example, solar, piezo electric, and inductive power sources for some embodiments. Similarly, other devices such as GPS receivers, low-power transmitters and data links, repeaters, and triggers can be incorporated into embodiments of the present invention to improve its usefulness in particular applications.

An object of the invention is an aircraft electrostatic charge diagnostic testing device, comprising a power source with at least one electrostatic field sensor coupled to the power source. The sensors are located proximate an aircraft landing area, wherein the sensor detects an electrostatic charge measurement of the incoming aircraft. The device also has a data link for transmitting the electrostatic charge measurement.

A further object is the aircraft electrostatic charge diagnostic testing device, wherein the power source is selected from the group comprising a connection to an external source, a battery and a solar cell. Also, wherein the sensors are located in a weather tight housing unit and wherein the housing unit is mounted on a non-conducting mounting pole.

Other variations of the present invention include the aircraft electrostatic charge diagnostic testing device, further comprising a global positioning system module providing timing for the electrostatic charge measurement. In addition, the device can employ a conducting strip that is switchably coupled to the power source and providing a built in test capability. Finally, the aircraft electrostatic charge diagnostic testing device, further comprising a memory device coupled to the electrostatic field sensor.

An object of the invention is an electrostatic sensor for testing aircraft electrostatic charge, comprising a power source with a sensing element for detecting an E-field signal. There is a first amplifier stage connecting to the sensing element on a first side, with a filter stage connecting to a second side of the first amplifier stage. An analog to digital converter is coupled to the filter stage for converting the E-field signal (analog) to digital E-field data. In addition, there is a memory section for storing the digital E-field data.

Another object is the electrostatic sensor, further comprising a data link for transmitting the digital E-field data. In addition, the electrostatic sensor can use a filter stage such as a 60 Hz notch filter. Also, the E-field sensor can further utilize a second amplifier stage between the filter stage and the analog to digital converter. In addition, the inventors have contemplated a means for processing the E-field data, wherein the means compares the E-field data to a pre-existing library of E-field data. The data can be used to identify characteristics to identify a particular aircraft and also be compared to data on previous landings to determine if there is some performance problem with that particular aircraft.

An object of the invention is a method for testing electrostatic discharge systems on aircraft comprising the steps of placing at least one E-field sensor proximate an aircraft runway, detecting an aircraft E-field signature, wherein the signature represents electric field changes as measured by the E-field sensor, and communicating the signature to a processing unit.

Yet a further object is the step of storing the E-field signature. Another step is performing coherent noise reduction. In addition, further comprising a step of retrieving aircraft information. The present invention can also include the step of logging the E-field signature along with the aircraft information.

An additional object is the method for testing electrostatic discharge systems, wherein the sensors are proximate a runway and the signatures are measured during landing. Also, further comprising the step of comparing the E-field signature to a database of signatures and indicating a failure of the electrostatic discharge systems if the E-field signature is out of an expected range. And, the method for testing electrostatic discharge systems can further comprise the step of measuring the E-field signature after the aircraft touches the runway.

Still other objects and advantages of the present invention will become readily apparent to those skilled in this art from the detailed description, wherein we have shown and described only a preferred embodiment of the invention, simply by way of illustration of the best mode contemplated by us on carrying out our invention. As will be realized, the invention is capable of other and different embodiments, and its several details are capable of modifications in various obvious respects, all without departing from the invention.

BRIEF DESCRIPTION OF THE DRAWINGS

The invention will be better understood upon reading the following Detailed Description in conjunction with the drawings in which:

FIG. 8a illustrates a charged body following a path proximate several E-field sensors

DESCRIPTION OF THE PREFERRED EMBODIMENT

To those skilled in the art, the invention admits of many variations. The following is a description of a preferred embodiment, offered as illustrative of the invention but not restrictive of the scope of the invention. E-field sensors and systems according to the present invention exploit unintended and unavoidable electrostatic emissions in the spectrum from sub 1 Hz to greater than 1 MHz. Testing of the sensors in 2002 at a moderate use airport revealed a static dissipation problem with approximately 10% of incoming aircraft among the major airlines.

Figure 1:
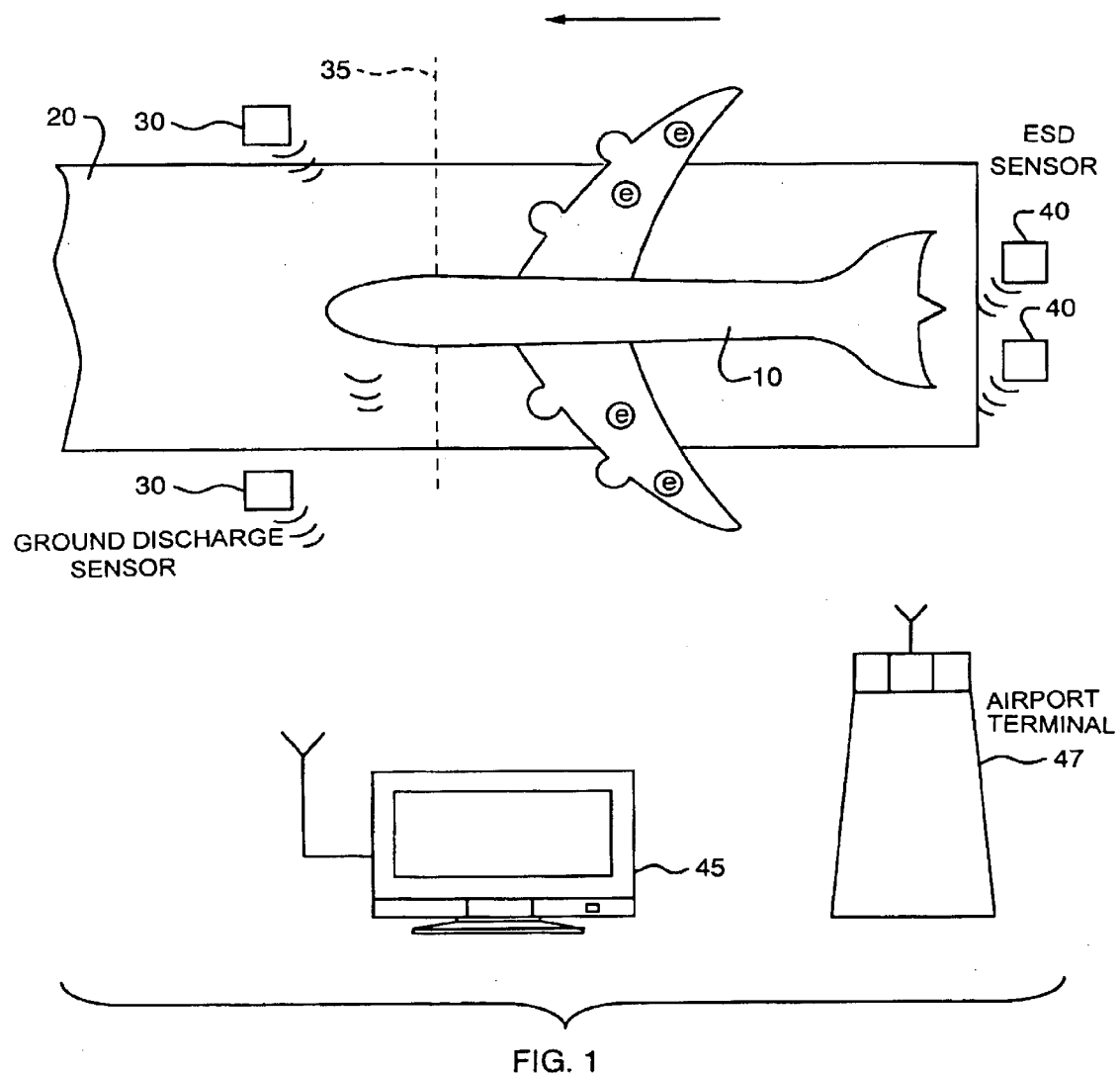
FIG. 1 depicts an aircraft runway showing a plane landing with a plurality of sensors located about the runway communicating to a central computer

As shown in FIG. 1, the present invention allows passive testing of airborne aircraft ESD systems that are supposed to eradicate electrostatic charge 'e' from building up on the surface skin of the plane 10. As an airplane 10 is landing on the runway 20, one ore more airborne testing sensor devices 40 are located in close proximity to the runway 20 prior to touchdown. The sensors 40 should be placed with an unobstructed view of the aircraft 10 and placed at points along the runway 20 so that a satisfactory measurement is achieved. In one embodiment the sensors 40 are located about the runway lights at the entrance of the runway 20, although they can also be oriented on the sides of the runway 20 prior to the point of touchdown 35. As the sensitivity of the sensors 40 can detect the significant signal of a failed ESD system at a considerable distance, the sensors 40 may be located anywhere in proximity of the landing strip. For detection of the air borne ESD 'e', the sensors 40 should be positioned before the aircraft tires touch the runway in order to detect the ESD performance before some of the charge diminishes upon landing. The location should also be situated away from known noise sources that might interfere with the measurements.

While a single airborne test sensor 40 is sufficient, multiple sensors allow better measurements by reducing the effects of extraneous noise and allow for redundancy and verification of failures. As the units are relatively inexpensive, the sensors 40 can be mounted at both ends of the runways and allow for changes in the flight patterns. The sensors 40 should be properly protected from the elements and runway maintenance such as snow removal procedures that might affect performance.

In one embodiment, the present invention monitors the airborne static discharge system for proper operation by measuring the electrostatic charge 'e' of the plane 10 before the touchdown section 35. Another embodiment also verifies the ground discharge system functions properly so that the operating personnel are alerted to a potential ESD problem. As described herein, airborne ESD system reduce charge buildup in flight, while other systems are ground based to ensure that any accumulated charge is dissipated upon landing. The ground discharge system is checked by placing sensors 30 along the runway 20 at a location after the touchdown 35. The ground discharge system is supposed to dissipate any charge 'e' that may have built up during flight. By measuring the post-touchdown electrostatic charge 'e', the present invention verifies the ground discharge system if maintenance is required. And, if there is a charge 'e' still on the plane after touchdown, it is important to notify maintenance personnel to avoid a possible fatal discharge.

There is a computer 45 or similar processing apparatus for assembling data from the plane 10 and the sensors 30, 40. The computer 45 in this embodiment employs wireless reception in order to receive data from all the runways with all the sensors 30, 40 and determines which aircraft had faulty airborne or ground based systems. The information can be processed and communicated to the airline maintenance center or logged by the airport terminal 47.

It is important to match the sensor measurements with the particular aircraft, so in one embodiment there is a feed from the airport flight information system (FIS) that identifies the aircraft. Another option is to utilize the information available directly from the airplane by interrogating the aircraft transponder. The present system can also be integrated into the various prior art identification systems that encompass cameras to capture the tail number of the aircraft. Yet another simplified technique is to encompass a system clock so that the time of the measurement is recorded and can be matched to the aircraft on the runway at that time.

Figure 2:
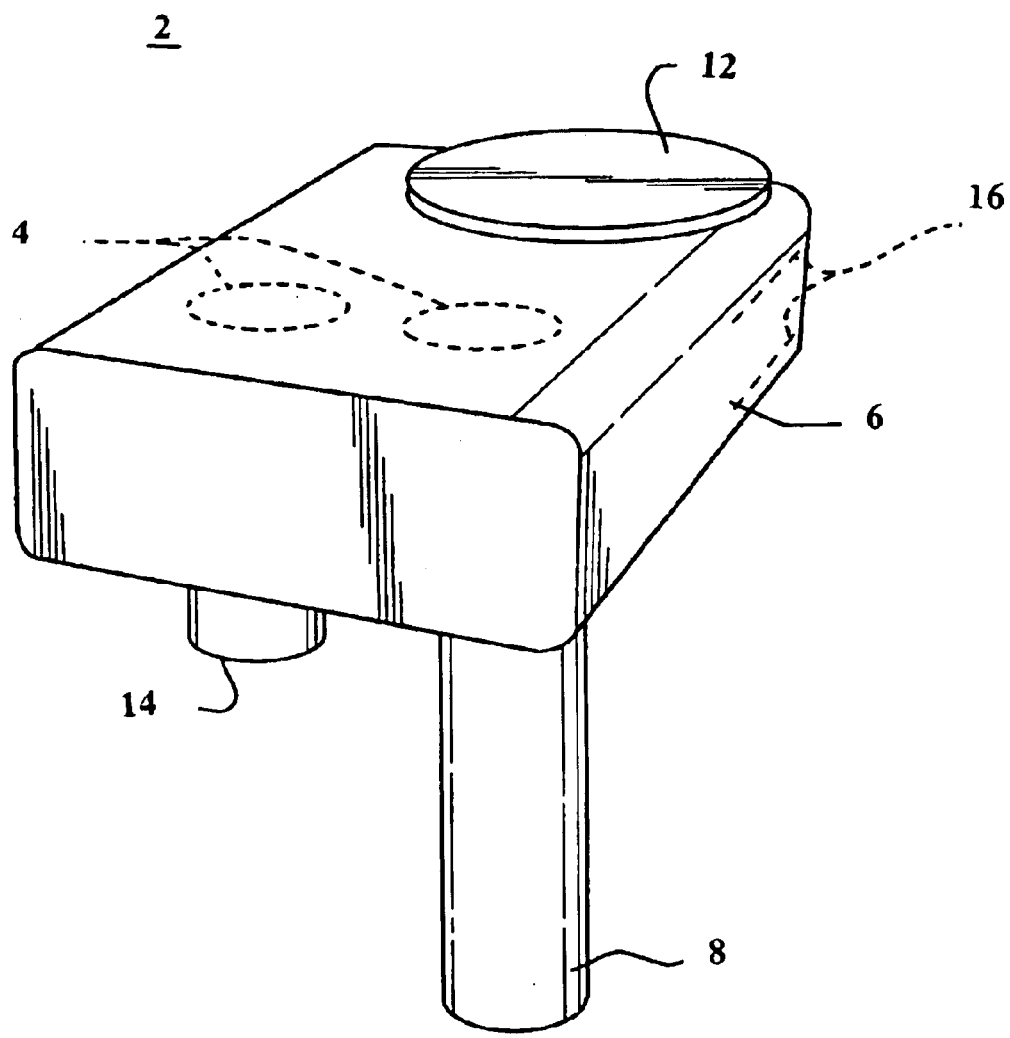
FIG. 2 illustrates one embodiment of the sensors and associated electronics housed in a sealed unit and attached to a mounting pole

Referring to FIG. 2, one embodiment of the aircraft electrostatic discharge test system 2 comprises sensors 4 mounted on non-conducting pole 8 that would keep the sensors 4 several feet above the ground. The height of the pole 8 should be sufficient to clear vegetation and snow accumulation and generally establish a clean line of sight between the aircraft and the sensors 4.

The entire sensor electronics can be packaged in a weather tight case 6 that protects the components from environmental conditions. The case 6 can be a closed housing and disposable due to the low cost of the individual components. Although shown mounted on a pole 8, the entire unit can be mounted to existing structures such as light stands with insulating connections to any structures of a conductive nature.

The power source for the unit in this embodiment is a solar cell 12 that operates using photovoltaic elements and is well known to those in the art. There can also be a battery (not shown) as well as an external power connector 14 for connection to a power source (not shown).

Figure 6:
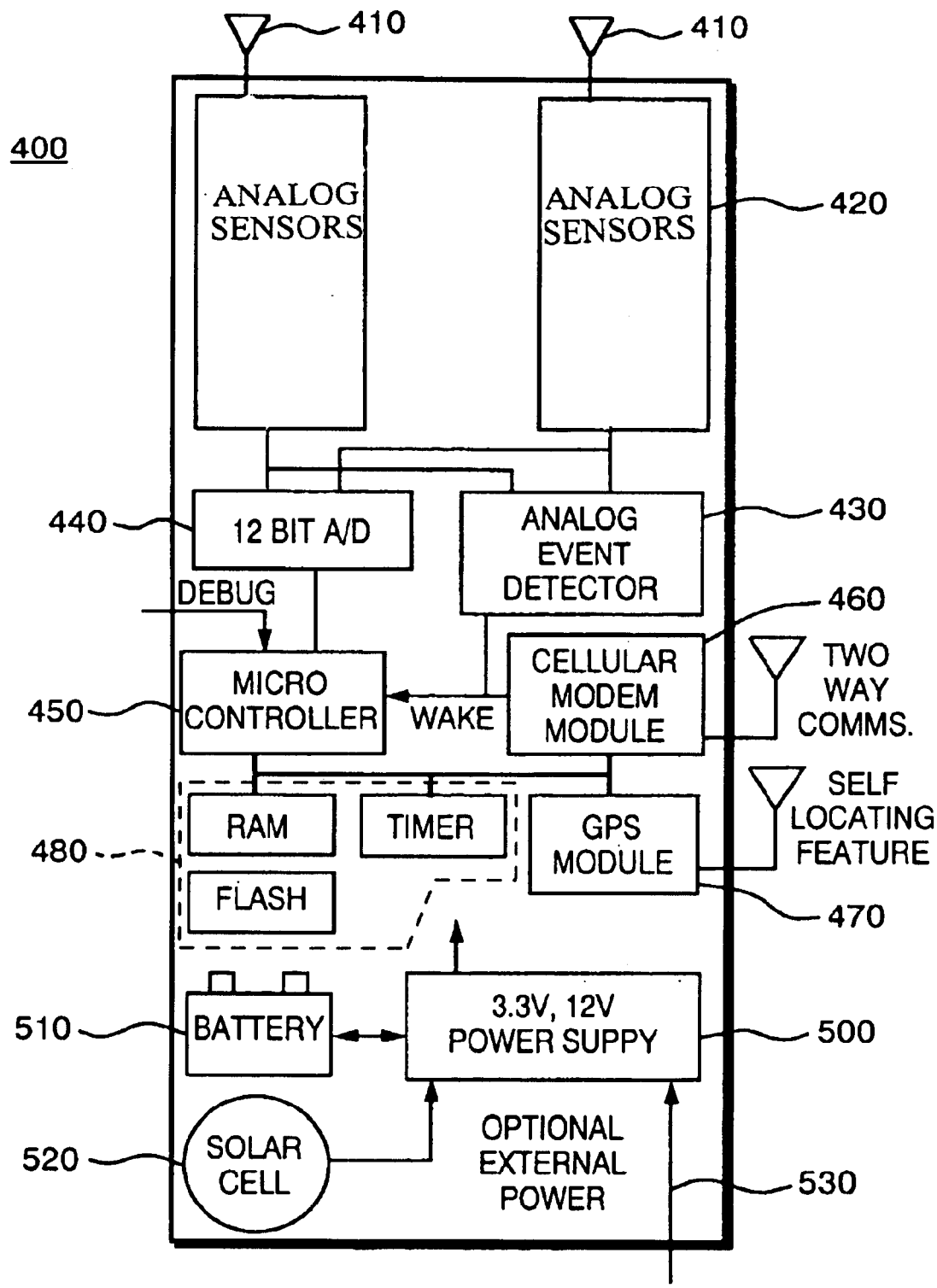
FIG. 6 shows one embodiment encompassing dual sensors in a single housing with associated electronics including communications link and power source

In order to communicate the measurement data to the outside world, a low power data link as illustrated in FIG. 6, can be connected and communication antennas 16 that would provide for transmission/reception capability. While the data can be recorded and stored within the unit, it is preferable to communicate the data to a processing location that use timely information about the aircraft. Therefore fixed wire communications and wireless communication have been contemplated and are within the scope of the invention.

Figure 3A:
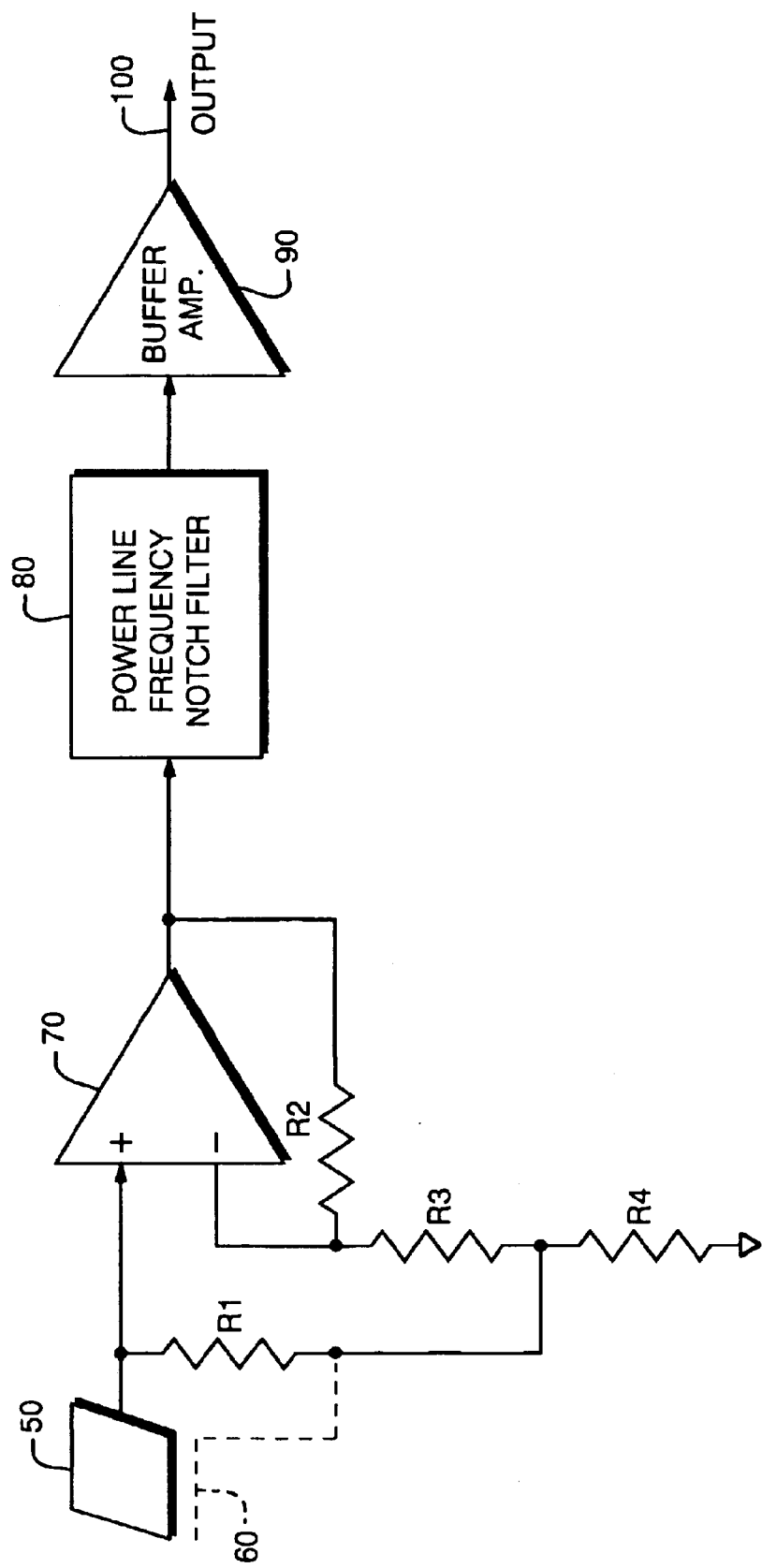
FIG. 3a is a block diagram representation of the present invention showing the sensing area coupled to a high impedance amplifier and notch filter
Figure 3B:
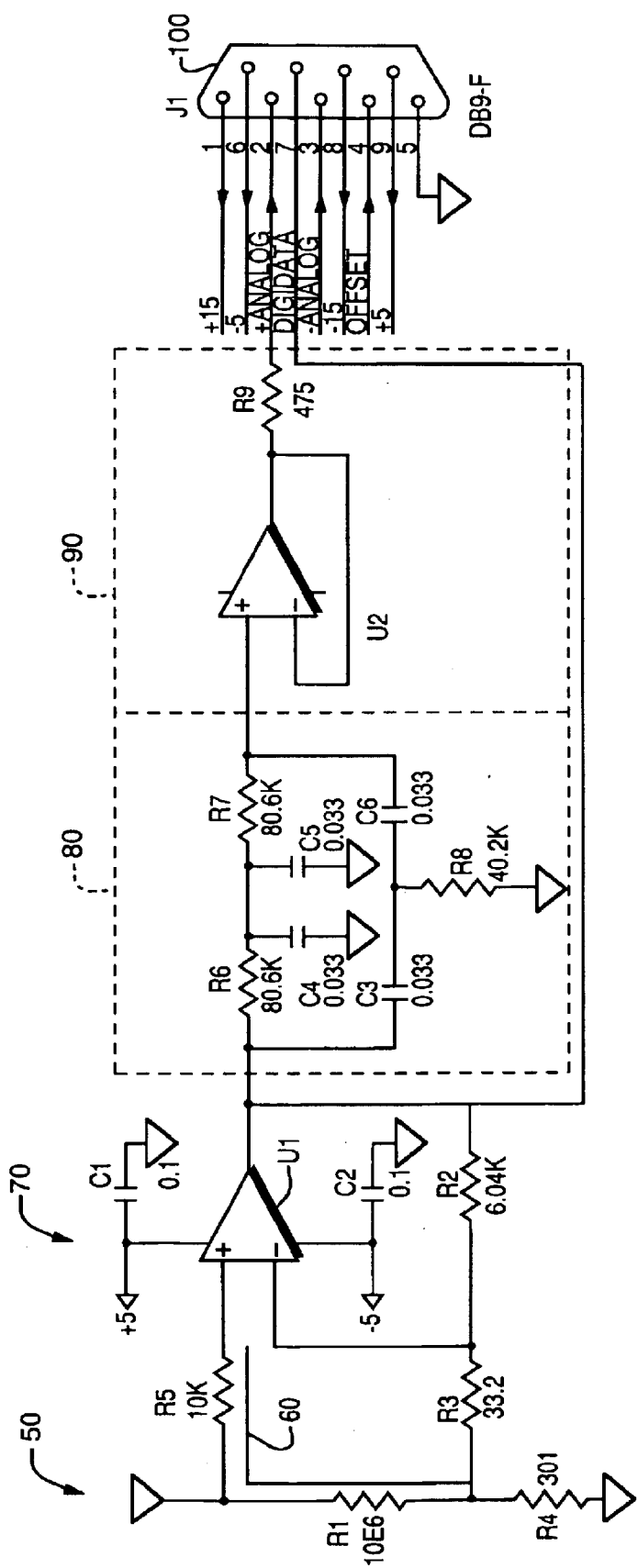
FIG. 3b is a schematic of one embodiment of the present invention, assembled to depict the sensing area coupled to filtering and amplification stages

FIG. 3a is a block diagram representing a simple embodiment of the present invention's sensor for detecting E-field distortions and illustrating the circuit arrangement as well as the interconnection of the imputs and outputs. FIG. 3b is the corresponding detailed schematic for one embodiment described herein.

The sensing area 50 is generally a small receptive element, and in a preferred embodiment the sensing area 50 is a printed wiring board etch although it could also be an external sphere or other receptive unit. In one embodiment the pad is approximately 1/30 inch and picks up signals up to 200 millivolts. There is a guard area 60 to reduce the capacitance, which according to the preferred embodiment is also printed wiring board etch under the sensing area 50.

The sensor area 50 is basically one side of a capacitor in one embodiment. The larger the area, the greater the sensitivity, and the sensor area 50 is one method to adjust system gain. Subsequent signal processing and filtering is used to reject unwanted signals. For example, narrow pulses or relatively high frequency signals such as those caused by lightening, arc welders, and RF sources would be rejected. A typical signal response in the range of 0.1–5 kHz does not have any DC biases.

The differential amplifier 70 is used to establish high impedance and provide amplification. The gain of the differential amplifier 70 is determined by the resistors R2, R3, and R4 and as is well known in the art, that the gain is equal to $(R2+R3+R4)/(R3+R4)$. The resistors R3 and R4 determine the percentage of input signal that is coupled to one side of R1 and the guard 60.

For example, R3=1 k and R4=9 k, the voltage at the junction of R3 and R4 is 90% of the voltage at the sensing area. In effect, R1 appears ten times larger, and the capacitance of the sensing area 50 to be ten times lower.

Expressed differently, if the voltage at the junction were 99.9% of that present at the sensing area, the R3 would appear 1000 times larger and the capacitance of the sensing area 50 would appear to be 1000 times smaller. Thus the ratio of R3 to R4 determines the input resistance to the amplifier 70. It is preferred to make the input impedance very high without having amplifier 70 saturate due to its input bias currents. Typical feedback ratios are from 90% to 99% while the value of R1 might be 10 Mohms, giving an effective input resistance of 100 to 1000 Mohms.

In a first embodiment, the differential amplifier 70 is a field-effect operational amplifier U1 (op amp TLC2272) to provide a high impedance for the sensing element 50. In this circuit, the sensing element 50 is a small metal piece that is part of the printed wiring board. The sensing element signal is amplified and converted to a low source impedance. R1 is 10 Mohm, R2 is 6.04 Kohm, R3 is 33.2 ohm and R4 is 301 ohm. An additional resistor R5 may be connected between the sensing area 50 and the + input of the differential amplifier 70 of approximately 10 Kohm to provide amplifier protection.

The power line frequency notch filter 80 is used to reject the field caused by nearby power lines and is set to the power line frequency for the region of use, generally 60 Hz in the United States. In the preferred embodiment, off-the-shelf commercial components are utilized. The 60 Hz notch filter 80 is inserted to reject power line and similar signal noise and minimizes the chance of saturation of the next amplifier stage. Those skilled in the art are familiar with the appropriate resistor and capacitor arrangement necessary to produce a 60 Hz notch filter 80. Other environments having differing noise parameters such as 50 Hz and 400 Hz can also be implemented.

The buffer amplifier 90 provides a high input impedance to the notch filter 80 while providing additional gain and a low impedance source for the voltage measuring device. Typically the measuring device is a sample-and-hold circuit followed by a analog-to-digital (A/D) converter and subsequent processing circuitry.

The buffer amplifier stage 90 is a second field-effect operational amplifier U2 (op amp TLC2272) and is used to achieve an approximate gain of 20 dB. A 15v DC power is supplied by common dry cell batteries, although any power source with acceptable output may be used. The sensor device's output signal is delivered to the next stage of the detection system.

Because assembling the basic sensor does not require unique and special components, it is anticipated that persons skilled in the art will choose components for practicing the present invention that will enable them to best configure the sensor to achieve the objectives of the sensor's application.

Figure 4:
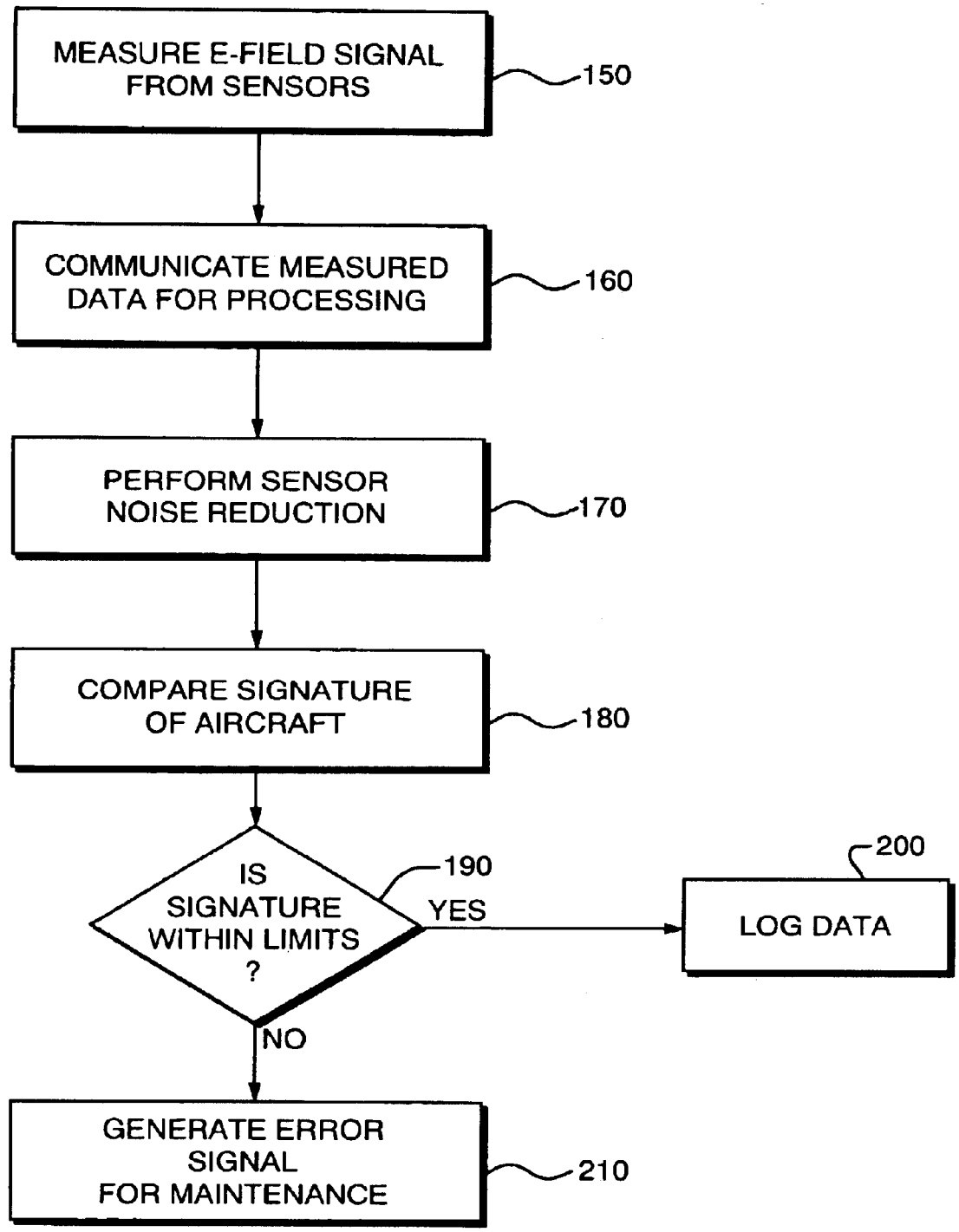
FIG. 4 is a flowchart of the steps in determining if the aircraft ESD system is functioning

FIG. 4 shows the basic flow of the signal processing in one embodiment to identify failed ESD systems and also to catalog electrostatic signatures of the aircraft. The first step is measuring the E-field signals from the sensors 150. As described herein, a plurality of remote sensors are installed along the runway to detect the E-field data from landing aircraft. The sensors can always be active or triggered by some event that would activate unit for performing the measurement. The measurement itself is generally taken for some length of time while the aircraft is approaching and passes directly over the sensors, as the sensing electronics is not power intensive. As described herein, the failure measurements are generally pronounced and would represent a large signal disruption over the time period.

The next step is communicating the measurement data to a central processing unit 160. In one embodiment the measured raw data is communicated to a central processing unit such as the airport tower or the airline maintenance facility. There can be a hardwire connection or wireless transmission hardware such as a low power 900 MHz RF link. The information is preferably associated with a particular aircraft and logged along with other maintenance history. The aircraft signature for the particular plane can also be recorded. It has been recognized that the measurement signal for particular aircraft are unique and establishes a signature waveform. The waveform of a particular class of aircraft is readily obtainable, such as DC-9's and Boeing 747's. It has been contemplated that more elaborate sensing can identify a particular aircraft within a class based on the signature. Cataloging the signature of the aircraft may provide additional maintenance information as the signature of a particular aircraft drifts away from the cataloged signature. Such a drift may indicate some detrimental change to the aircraft.

The processing can be done at the remote sensor location, but would require a microcontroller aboard with associated electronics and a memory device for storing data. Once the data was processed, it would still require communication transmission to be helpful, thus the processing can be done transmitted as raw data for processing at a central location.

The next step in the process typically involves noise reduction 170. The noise reduction is an optional step and can only be performed if there is data from two or more sensors. The coherent noise reduction works because the background noise is "far field" and low frequency. This means that two sensors placed several feet apart see exactly the same background noise. If the signal of interest is in the near field, (less than 100 feet in one test) the sensors see the signal of interest at different signal strengths. When the two sensors are subtracted, the background noise disappears while some of the signal of interest remains. No knowledge of the background noise is required. This technology is similar in some respects to the techniques used in noise reduction head sets and microphones.

This is distinguishable from bandpass filters, low pass filters, and high pass filters, that essentially reject interfering signals within a certain frequency. Bandpass filters reject signals in a certain frequency band. High pass filters reject lower frequency signals while allowing higher frequency signals. Low pass filters allow certain lower frequency signals while rejecting high frequency signals.

The noise reduction processing can be shown by the following equations for two sensors:

S1(t) is the total signal received at sensor 1

P1(t) is the signal at S1 from the signal of interest

Nb(t) is the background noise (assumed to be far field and therefore the same at both sensors)

S2(t) is the total signal received at sensor 2

P2(t) is the signal at S2 from the signal of interest $$S1(t)=Nb(t)+P1(t)$$

$$S2(t)=Nb(t)+P2(t)$$

$$P2(t)=kP1(t)$$

$$K<1$$

$$Sdiff=S1(t)-S2(t)=(Nb(t)+P1(t))-(Nb(t)+P2(t))$$

$$Sdiff=P1(t)-kP2(t)$$

$$Sdiff=(1-k)P1(t)$$

The signal of interest is somewhat reduced in strength but background noise is essentially eliminated without filtering or smoothing that can deteriorate the information signal. Thus signal to noise ratio (SNR) is greatly improved and this aspect is described in further detail herein.

The comparing of the E-field signatures 180 is the next step. The measured E-field signature from the sensors is compared to a library of signatures. The preferred comparison is to use the signature from the same aircraft if available. If that particular aircraft has not previously been recorded, then the data is compared to the same type of aircraft. If there is no data for that type of aircraft, the measurement will be based upon expected results The signatures are compared to each other and evaluated for the differences within certain limits 190 according to this next step. The most accurate comparison and tightest limits would be for using the data recorded from the same plane. The differences between the measurements from the same plane at different times will not have much variation if the ESD system was working properly. The difference between similar planes would be subject to some variation, but the limits would be set to account for such variation. If there were no previous signatures for a particular plane, some interpolation would provide a rough estimate to establish a baseline and there would be a wider margin for error. Fortunately, malfunctioning ESD systems tend to have a much different signature and would be detectable in most cases even if there was no comparable plane signature.

If the signature is within the prescribed limits, the next step would be to record the signature for that particular plane and log the data for maintenance records 200. However, if the signature is not within the set limits 210, the next step would be to record the data for that plane and generate an error signal for maintenance. There are a number of ways to communicate the signal, including various audio/visual means known to those in the art. Preferably the signal would alert the air traffic tower that could inform the pilots and have the aircraft sent promptly to maintenance.

One of the features of the present invention is the application of coherent processing to reducing background noise, wherein coherent processing is applied to the sensor outputs as a means of canceling out the background noise. As detailed herein, the coherent processing of the detected E-field disturbance improves the data results such that the particular source of the E-field disturbance can be detected at useful distances and distinguished from other E-field disturbance and noise sources in the vicinity. Also, it is anticipated that experience using the present invention enables sophisticated output interpretation similar to that presently applied to spectrum detected by prior art such that identification of source parameters such as surface area, height, propellant composition, line current and voltage, and specific moving platform identification are achievable.

Figure 5:
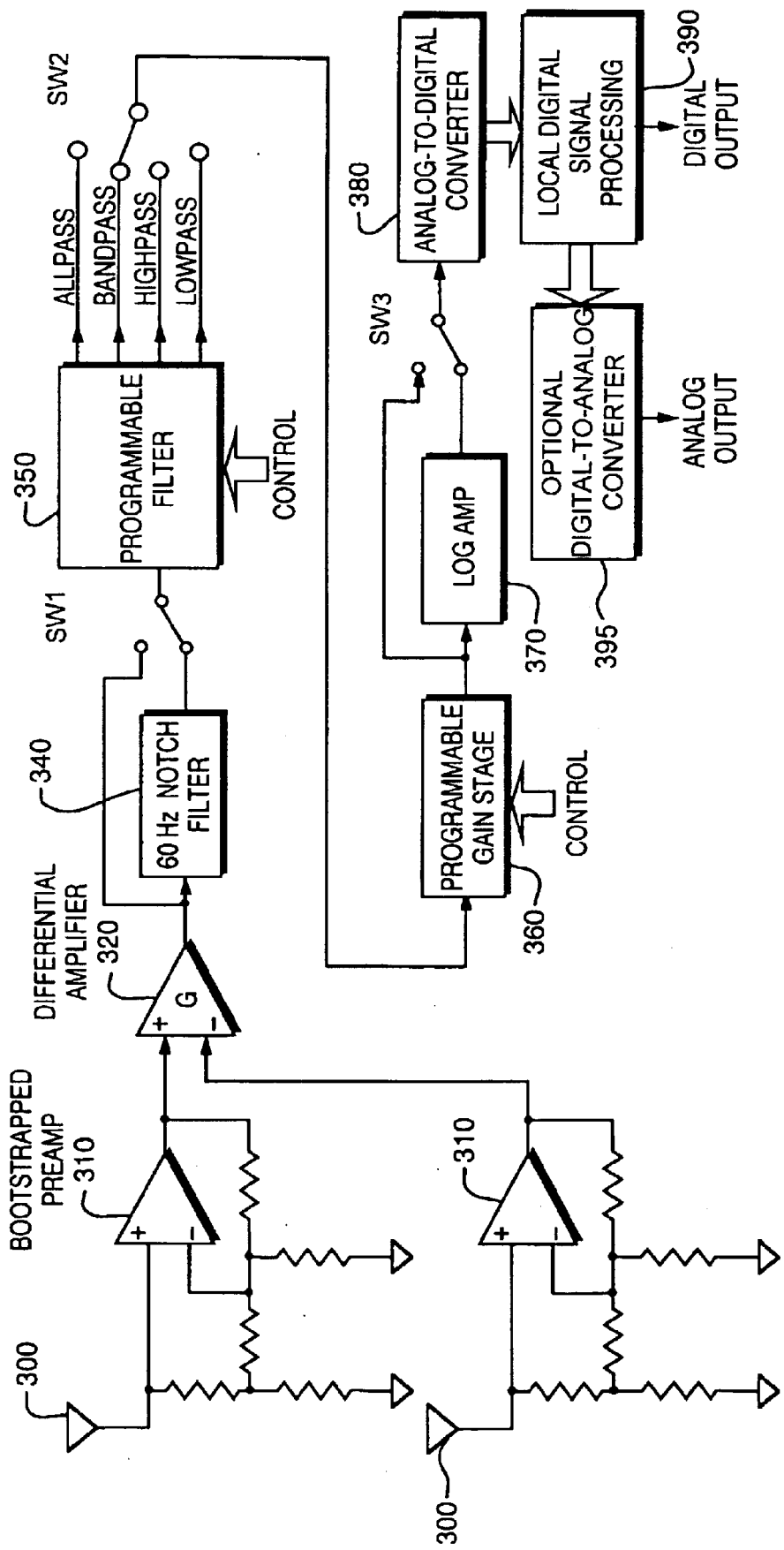
FIG. 5 is a block diagram view of multiple sensors interconnected to a central processor showing the connections from the amplifiers to the digital converter and the signal processing unit

FIG. 5 shows one embodiment that encompasses multiple sensors 300 and the signal processing requirements. In this presentation, the output of a first sensing element 50 and amplification stage 110 are used as the input to a first A/D converter 120. In this depiction the amplification stage may be a single amplifier 110 with appropriate characteristics or multiple components as shown herein. There are typically at least two sensors, each connecting to A/D converters 120. The A/D converters 120 are all connected to a processing unit 130 to enable processing of the signals. The parallel connections allow the processing unit 130 to gather data from multiple sensors and process the data.

In one embodiment, the processing unit has an internal memory device or connection to a memory device that stores the measured data. The recorded data is used to establish a library of E-field signatures. The E-field signatures represent the measurements for a particular aircraft, such as a Boeing 727 or Airbus 300. The E-field signatures can also be stored for a particular airplane. This stored data is useful when comparing the present measurements to the existing data.

The present invention is intended to monitor and track aircraft signatures. Therefore it is useful to record aircraft information along with the measured data. Aircraft information can be co-processed with the measurement data in a number of ways, including using aircraft transponder data that is captured at the same time as the E-field measurements. Alternatively, the aircraft data can be obtained based on information from the tower by tracking the time and flight information on a given runway with the FAA Airport Flight Information System (FIS) via a flight data interface (FDI) or other air traffic data interface feeds.

A representative embodiment of a differential field sensor according to the present invention is disclosed in FIG. 5. This embodiment employs two sensing elements 300 and two preamps 310 running to a differential amplifier 320 and 60 Hz notch filter 340. A programmable filter 350 via SW1 and programmable gain stage 360 via SW2, and logarithmic amplifier 370 (log amp) are employed to process and boost the electrostatic signature of the detected source prior to its passage via SW3 to the analog and digital converters 380 and 395 and processors 390 necessary to configure the output signal parameters for use by the next stage of the detection system. The differential field sensor's output is delivered to the next stage of the detection system at terminal. Because assembling a differential field sensor does not require unique and special components, it is anticipated that persons skilled in the art will choose components for practicing the present invention that will enable them to best configure the sensor to achieve the objectives of the sensor's application.

Referring to FIG. 6, an embodiment for a complete sensing unit 400 encased within a housing 405. The antenna element 410 can be mounted external to the housing 405, but also within the housing 405 depending upon the application specifics. The analog processing electronics 420 functions as described herein, with the sensing antenna pad 410 measuring electrostatic charge which is subsequently filtered and amplified.

The analog output of the processing electronics 420 is delivered to an event detector that is preset to a certain voltage level in order to wake up the microcontroller 450 once a certain level is detected. In this embodiment, the sensing unit 400 processes the information internally and maintains the data until a failure is detected. The event detector allows elements of the unit 400 to consume lower power levels until a failure or for batched transmission of data. The output of the processing electronics also connects to an analog-to-digital (A/D) converter 440 that converts the analog voltage signal to a digital form.

A microcontroller 450 is the control center for the unit 400 and controls the subsequent processing once an event is detected. In a first embodiment a global position system (GPS) module 470 is coupled to the microcontroller 450 in order to establish an extremely accurate standard time reference. Other types of clock references are also within the scope of the invention such as internal local oscillators. In one application, the timing is used to coordinate with the aircraft landing times to identify a particular aircraft and match to the data taken from the aircraft.

In one embodiment the GPS module 470 uses the position information data from the sensor location in coordination with the aircraft position information to determine which aircraft is being analyzed by the device. The updated sensor position information is also useful if the sensors are moved or continuously re-located. The aircraft information is accessible from the Federal Aviation Administration (FAA) data links.

The microcontroller 450 is also coupled to a cellular modem module 460 that is a low power RF link to the outside world and allows the unit 400 to transmit and receive data. The data link 460 may extract aircraft information from the aircraft, the tower, or from maintenance departments that can be coupled to the measurement results. The data link also can transfer the measurement information to the tower, aircraft or maintenance departments. There are additional elements 480 associated with the microcontroller 450 to provide random access memory (RAM) and flash memory as well as timing circuits.

The power source for the unit 400 is derived from several possible sources. There can be an external power supply connected to the external connection 530 that provides the power directly or through a transformer unit (not shown). In the illustrated embodiment the power source is DC, such as a 3.3V DC or 12V DC, however other power sources are possible with appropriate power conditioning. A battery 510 may be the sole source of power, and coupled to the power distribution section 500 that redirects the power and encompasses appropriate filtering and fuse protection. A solar cell 520 can be used to operate the unit 400 and also provide a power source that can charge the battery 510 and extend the life span of the unit 400.

Another feature of the present invention is a built-in-test capability. A metal rod or conducting strip on the printed circuit board can be charged by coupling to the power source, wherein the sensors should pick up the signal energy.

Figure 7:
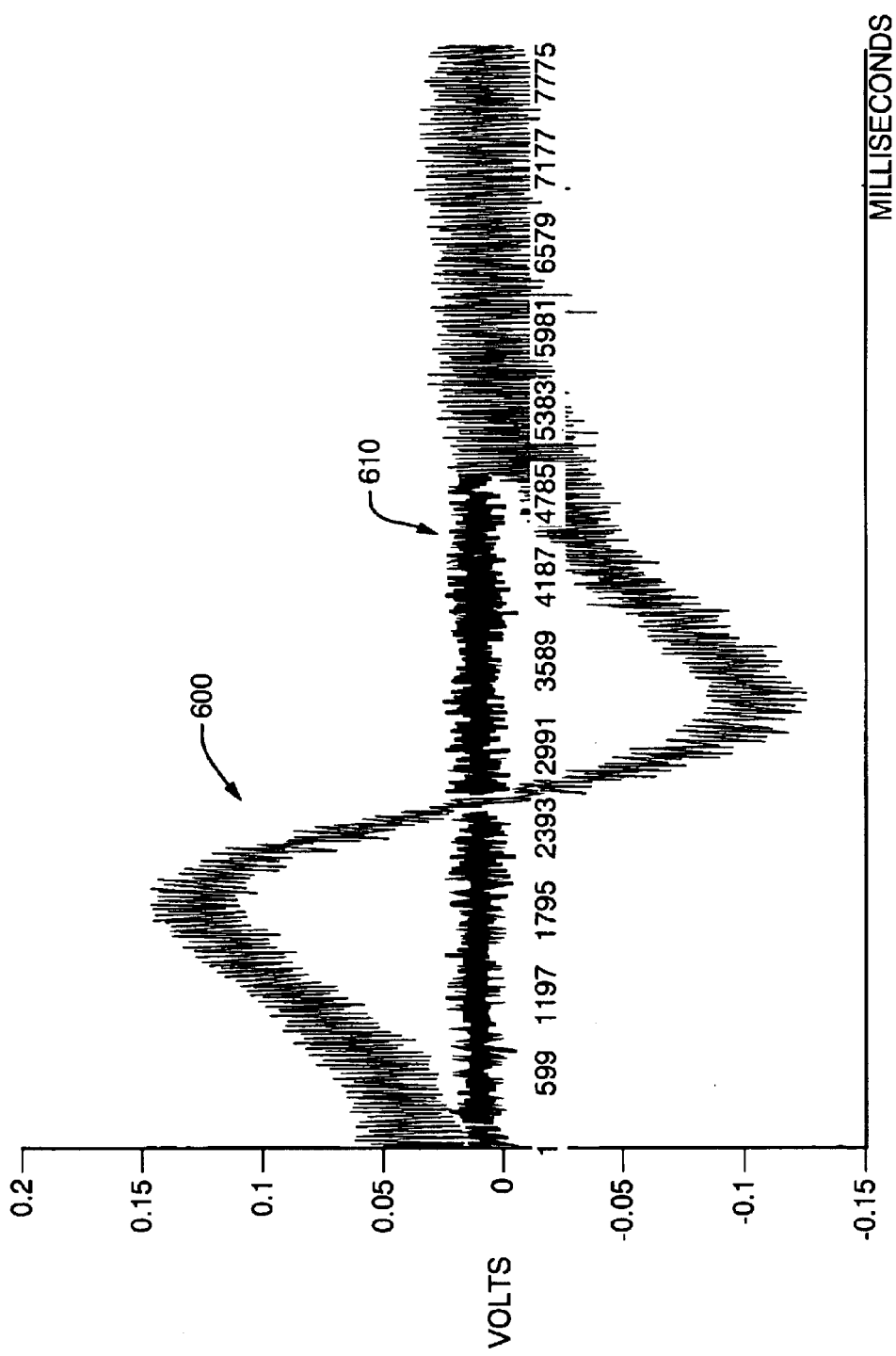
FIG. 7 is an illustration of the E-field detection results from commercial aircraft

FIG. 7 is actual test data which illustrates the differences detected by the preferred embodiment of the present invention between the E-Fields of a DC-9 with failed ESD 600 and a DC-9 with a functional system 610. The failed system 410 displays a wave significantly displaced from that of the functioning system 420. The effectiveness of the sensors is visible, as the failure is easily distinguished. As described herein, the electrostatic signal (Volts) detected by the sensors are measured over time (milliseconds). It is difficult to assess the actual voltage of the aircraft, but a small sensor pad located approximately 300 feet from the aircraft that can measure such a significant charge clearly equates to a very large potential and dangerous charge on the aircraft.

It is anticipated that detection sensitivity and detection range of the sensor can be improved by sensor component and sensor circuitry refinements while remaining within the scope of the present invention. Further, the inventor does not consider the detection examples used in this disclosure to be limiting, but rather that they are representative of the capabilities of the present invention in its basic embodiment and as experimentally demonstrated to be feasible.

In a simple embodiment, the detected signal would be time stamped and could include a digital photograph of the aircraft to ascertain the type of craft, airline company, and markings to properly classify the measured data to the proper aircraft.

One of the features as discussed herein is the application of coherent processing to reducing background noise. The example shown in FIG. 8a illustrates a simple configuration of a charged object 700 having an electrostatic field 'e' that travels along a path 710 that passes a series of sensors A–D spaced apart from each other along the path. Coherent processing provides a means of canceling out the background noise without smoothing or filtering that tends to distort the information signal.

Figure 8B:
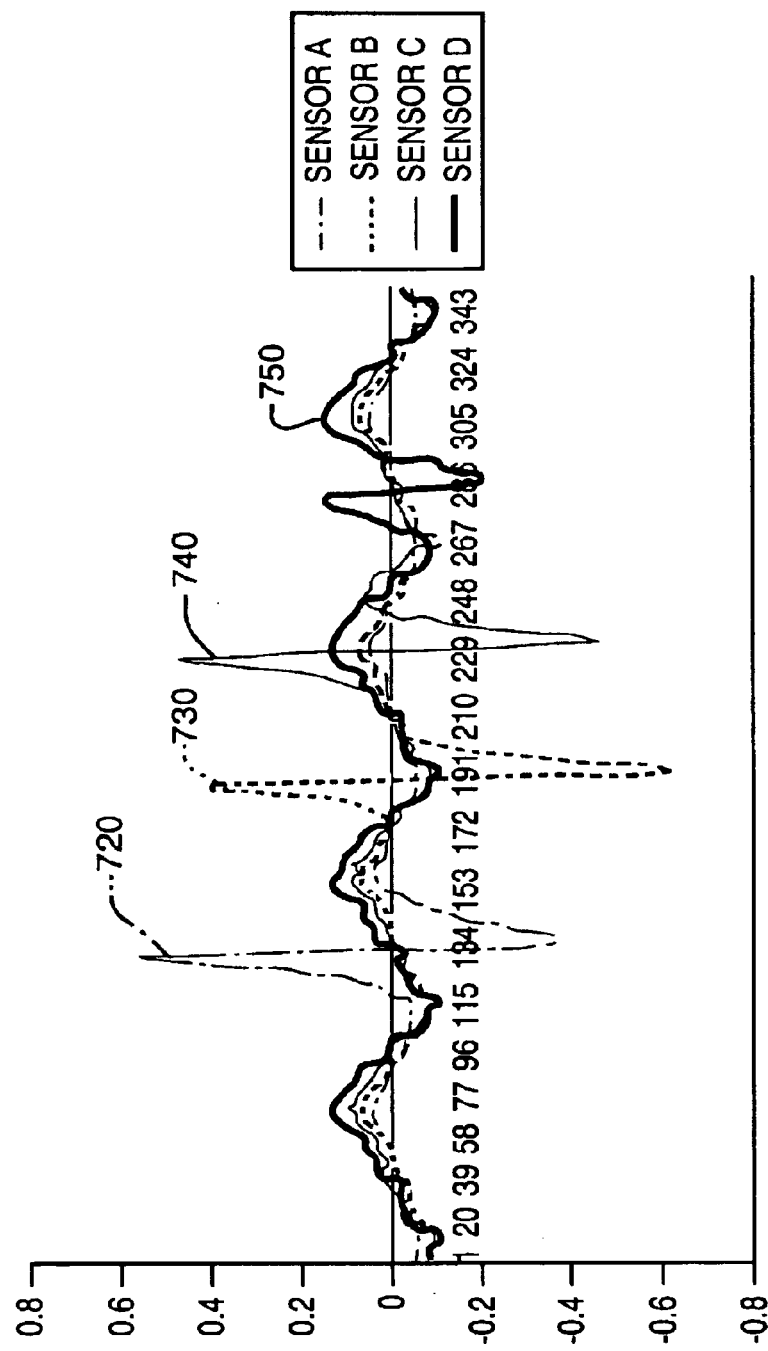
FIG. 8b shows a close-up of the sensor measurement data for four sensors and illustrating the noise level

In this particular example, the object is 'overcharged' so that the electrostatic field decreases as the object continues along the trajectory, wherein the energy level decreases at each successive sensor as shown in FIG. 8b. Sensor A voltage level is illustrated with the corresponding voltage measurement data 720 as the charged object 700 passes bye the sensor A. Likewise, the response for sensor B is shown by the voltage measurement data 730; voltage response for Sensor C is show by the curve 740; finally, the response of Sensor D is depicted by the measured data 750. As illustrated, the response data from all the Sensors A–D has some noise component, while the results from Sensor D are almost lost in the noise. This low signal to noise ratio (SNR) makes it difficult to process the measurements and use the data, as the noise level 760 makes it difficult to detect any other signals at or below the level of the noise floor 760.

Figure 8C:
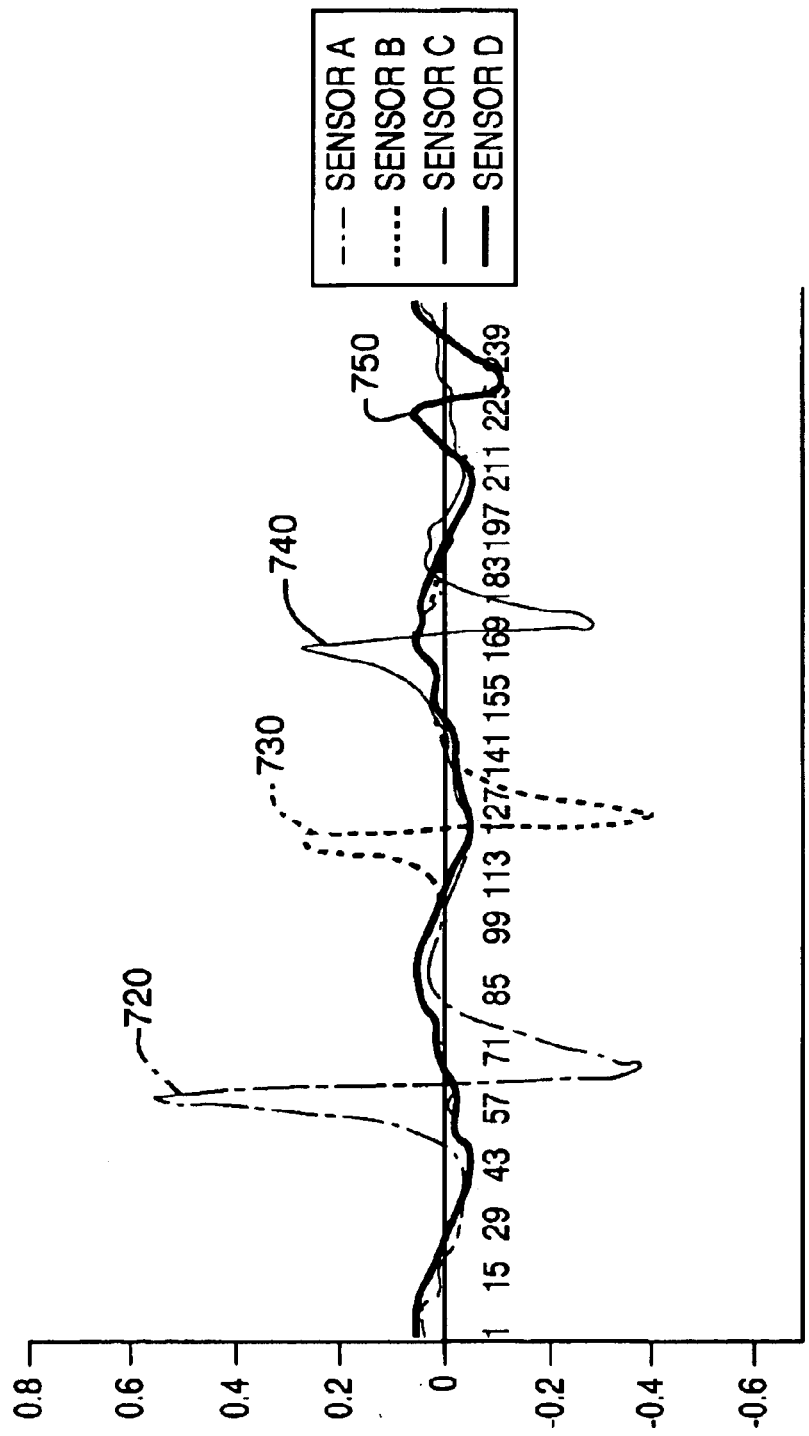
FIG. 8c shows the normalized version of the measurement data
Figure 8D:
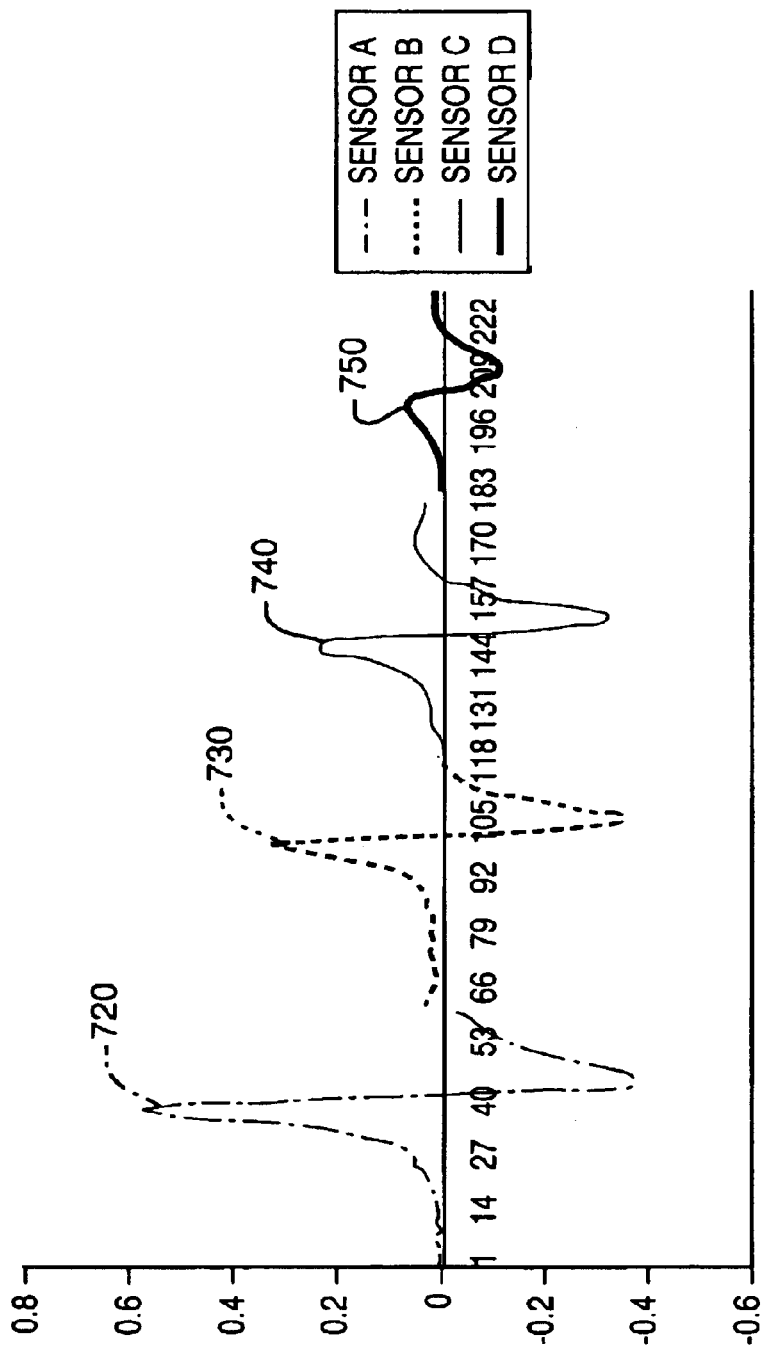
FIG. 8d is the measurement data waveforms after coherent noise reduction

FIG. 8c are test data results that show the channel gains are normalized, while the coherent noise reduction results are shown in the test data results of FIG. 8d. The coherent noise reduction as shown in FIG. 8d eliminates essentially all the interfering noise and allows detection and processing of very weak signals and drastically increases the SNR capabilities. For example, the data from Sensor D is easily detectable in this latter coherent processed illustration.

Accordingly, persons skilled in the art can apply the coherent processing outputs of the present invention to analysis of the detected E-field disturbance such that the particular source of the E-field disturbance can be detected at useful distances and distinguished from other E-field disturbance and noise sources in the vicinity. Also, it is anticipated that experience using the present invention enables sophisticated output interpretation similar to that presently applied to spectrum detected by prior art such that identification of source parameters such as surface area, height, propellant composition, line current and voltage, and specific moving platform identification are achievable.

The objects and advantages of the invention may be further realized and attained by means of the instrumentalities and combinations particularly pointed out in the appended claims. Accordingly, the drawing and description are to be regarded as illustrative in nature, and not as restrictive.

What is claimed is:

1. An aircraft electrostatic charge diagnostic testing device, comprising:
    a power source;
    at least one electrostatic field sensor coupled to said power source and located proximate an aircraft landing area, wherein said sensor detects an electrostatic charge measurement of said incoming aircraft;
    a data link for transmitting said electrostatic charge measurement; and
    a means for processing said electrostatic charge measurement, wherein said means compares said electrostatic charge measurement to a ore-existing library of E-field data to determine whether an electrostatic discharge system of said aircraft is functioning properly.

2. The aircraft electrostatic charge diagnostic testing device, according to claim 1, wherein said power source is selected from at least one of the group consisting of: a connection to an external source, a battery and a solar cell.

3. The aircraft electrostatic charge diagnostic testing device, according to claim 1, wherein said sensors are located in a weather tight housing unit and wherein said housing unit is mounted on a non-conducting mounting pole.

4. The aircraft electrostatic charge diagnostic testing device, according to claim 1, further comprising a global positioning system module providing timing for said electrostatic charge measurement.

5. The aircraft electrostatic charge diagnostic testing device, according to claim 1, further comprising a memory device coupled to said electrostatic field sensor.

6. An electrostatic sensor for testing aircraft electrostatic charge, comprising:
    a power source;
    a sensing element for detecting an E-field signal;
    a first amplifier stage connecting to said sensing element on a first side;
    a filter stage connecting to a second side of said first amplifier stage;
    an analog to digital converter coupled to said filter stage for converting said E-field signal to digital E-field data; and
    a memory section for storing said digital E-field data.

7. The electrostatic sensor according to claim 6, further comprising a data link for transmitting said digital E-field data.

8. The electrostatic sensor according to claim 6, wherein said filter stage is at least one notch filter.

9. The E-field sensor according to claim 6, further comprising a second amplifier stage between said filter stage and said analog to digital converter.

10. The E-field sensor according to claim 6, further comprising a means for processing said E-field data, wherein said means compares said E-field data to a pre-existing library of E-field data.

11. A method for testing electrostatic discharge systems on aircraft comprising the steps of:
    placing at least one E-field sensor proximate an aircraft runway;
    detecting an aircraft E-field signature, wherein said signature represents electric field changes as measured by said E-field sensor;
    communicating said signature to a processing unit; and
    determining whether said electrostatic discharge systems of said aircraft is functioning properly.

12. The method for testing electrostatic discharge systems according to claim 11, further comprising a step of storing said E-field signature.

13. The method for testing electrostatic discharge systems according to claim 11, further comprising a step of performing coherent noise reduction.

14. The method for testing electrostatic discharge systems according to claim 11, further comprising a step of retrieving aircraft information.

15. The method for testing electrostatic discharge systems according to claim 11, further comprising a step of logging said E-field signature along with said aircraft information.

16. The method for testing electrostatic discharge systems according to claim 11, wherein said sensors are proximate a runway and said signatures are measured during landing.

17. The method for testing electrostatic discharge systems according to claim 11, further comprising the step of measuring said E-field signature after said aircraft touches said runway.

* * * * *